US012740396B2

(12) United States Patent
Park

(10) Patent No.: US 12,740,396 B2
(45) Date of Patent: Sep. 15, 2026

(54) SEMICONDUCTOR DEVICE COMPRISING BONDED A PLURALITY OF SEMICONDUCTOR STRUCTURES ALONG WITH CONDUCTIVE LAYERS AND BONDING PADS

(71) Applicant: SK hynix Inc., Gyeonggi-do (KR)

(72) Inventor: Jin Won Park, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 738 days.

(21) Appl. No.: 18/104,789

(22) Filed: Feb. 2, 2023

(65) Prior Publication Data

US 2024/0079362 A1 Mar. 7, 2024

(30) Foreign Application Priority Data

Sep. 1, 2022 (KR) ........................ 10-2022-0110521

(51) Int. Cl.
*H10W 20/43* (2026.01)
*H10W 72/90* (2026.01)
(Continued)

(52) U.S. Cl.
CPC ......... *H10W 20/43* (2026.01); *H10W 80/743* (2026.01); *H10W 72/926* (2026.01);
(Continued)

(58) Field of Classification Search
CPC . H10W 20/43; H10W 90/792; H10W 72/926; H10W 72/936; H10W 72/932;
(Continued)

(56) References Cited

U.S. PATENT DOCUMENTS

2014/0117546 A1 5/2014 Liu et al.
2015/0279888 A1* 10/2015 Chen ...................... H01L 25/50 257/459

(Continued)

FOREIGN PATENT DOCUMENTS

KR 10-2022-0060620 A 5/2022

OTHER PUBLICATIONS

Office Action for Korean Patent Application No. 10-2022-0110521 issued by the Korean Patent Office on Feb. 13, 2026.

*Primary Examiner* — Didarul A Mazumder
(74) *Attorney, Agent, or Firm* — IP&T GROUP LLP

(57) ABSTRACT

A semiconductor device may include: a first semiconductor structure including a first conductive layer and four first bonding pads connected to the first conductive layer; and a second semiconductor structure including a second conductive layer and four second bonding pads connected to the second conductive layer, wherein the four first bonding pads are configured to be disposed to have respective centers each overlapping four intersections that are formed by two virtual first straight lines extending in parallel in a first direction and two virtual second straight lines extending in parallel in a second direction intersecting the first direction, where each of the four first bonding pads has four quadrants divided by the first straight line and the second straight line, and wherein, when the first semiconductor structure and the second semiconductor structure are normally aligned, the four second bonding pads are configured to be disposed to have respective centers that are displaced in directions from the respective centers of the four first bonding pads toward different quadrants.

20 Claims, 5 Drawing Sheets

(51) Int. Cl.
*H10W 80/00* (2026.01)
*H10W 90/00* (2026.01)

(52) U.S. Cl.
CPC ........ *H10W 72/932* (2026.01); *H10W 72/936* (2026.01); *H10W 72/9415* (2026.01); *H10W 80/701* (2026.01); *H10W 80/721* (2026.01); *H10W 80/732* (2026.01); *H10W 90/792* (2026.01)

(58) Field of Classification Search
CPC . H10W 80/312; H10W 80/701; H10W 90/26; H10W 90/00
USPC .......................................................... 257/734
See application file for complete search history.

(56) References Cited

U.S. PATENT DOCUMENTS

2019/0279965 A1 9/2019 Lattard
2022/0037268 A1* 2/2022 Shen .................. H01L 25/0657

* cited by examiner

SEMICONDUCTOR DEVICE COMPRISING BONDED A PLURALITY OF SEMICONDUCTOR STRUCTURES ALONG WITH CONDUCTIVE LAYERS AND BONDING PADS

CROSS-REFERENCE TO RELATED APPLICATION

This application claims priority under 35 U.S.C. § 119 to Korean Patent Application No. 10-2022-0110521 filed on Sep. 1, 2022, which is incorporated herein by reference in its entirety.

BACKGROUND

1. Technical Field

Various embodiments of the present disclosure relate to a semiconductor technology, and particularly, to a semiconductor device including two or more stacked semiconductor structures.

2. Related Art

Electronic products require high data processing capacity even though their sizes are getting smaller. Accordingly, semiconductor structures such as semiconductor chips and wafers used in these electronic products are also required to be thin and small. Furthermore, a form of embedding a plurality of semiconductor structures in one semiconductor device is being implemented.

A plurality of semiconductor structures may be electrically connected to each other while being stacked in a vertical direction.

SUMMARY

In one embodiment, a semiconductor device may include: a first semiconductor structure including a first conductive layer and four first bonding pads connected to the first conductive layer; and a second semiconductor structure including a second conductive layer and four second bonding pads connected to the second conductive layer, wherein the four first bonding pads are configured to be disposed to have respective centers each overlapping four intersections that are formed by two virtual first straight lines extending in parallel in a first direction and two virtual second straight lines extending in parallel in a second direction intersecting the first direction, where each of the four first bonding pads has four quadrants divided by the first straight line and the second straight line, and wherein, when the first semiconductor structure and the second semiconductor structure are normally aligned, the four second bonding pads are configured to be disposed to have respective centers that are displaced in directions from the respective centers of the four first bonding pads toward different quadrants.

In one embodiment, a semiconductor device may include: a first semiconductor structure including a first conductive layer and a plurality of first bonding pads; and a second semiconductor structure including a second conductive layer and a plurality of second bonding pads, wherein the plurality of the first bonding pads are connected to the first conductive layer and the plurality of the second bonding pads are connected to the second conductive layer, wherein centers of the first bonding pads aligned in a first direction lie on a first virtual straight line and in a second direction lie on a second virtual straight line, and wherein, when the first semiconductor structure and the second semiconductor structure are normally aligned, one vertex of each of the second bonding pads are disposed to contact an intersecting point between the first vertical straight line and the second virtual straight line from a plan view.

In one embodiment, a semiconductor device may include: a first semiconductor structure including a first conductive layer and four first bonding pads connected to the first conductive layer; and a second semiconductor structure including a second conductive layer and four second bonding pads connected to the second conductive layer, wherein, when the first semiconductor structure and the second semiconductor structure are normally aligned, the four first bonding pads are configured to be disposed to have respective centers that are displaced from respective centers of the four second bonding pads, and wherein a total contact area of the four first bonding pads to the four second bonding pads is maintained even with misalignment of the first semiconductor structure and the second semiconductor structure.

DETAILED DESCRIPTION

Figure 1:
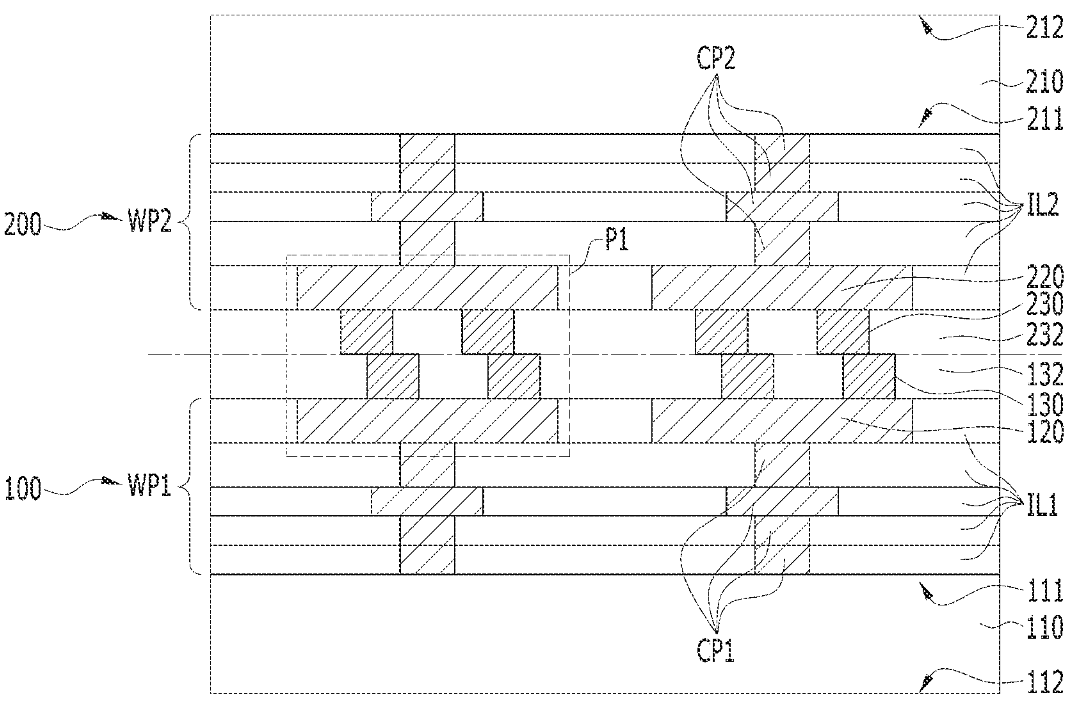
FIG. 1 is a cross-sectional view illustrating a semiconductor device according to one embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being “on” or “over” a second layer or “on” or “over” a substrate, the first layer may be directly formed on the second layer or the substrate but may also represent a structure where one or more other intermediate layers may exist between the first layer and the second layer or the substrate.

In the following description, a semiconductor structure may mean a semiconductor chip, wafer, or the like, including a circuit and/or wiring structure that performs a predetermined function. Also, a semiconductor device may include two or more semiconductor structures that are stacked in a vertical direction and electrically and/or physically connected to each other. Hereinafter, it will be described in more detail with reference to the drawings.

FIG. 1 is a cross-sectional view illustrating a semiconductor device according to one embodiment of the present disclosure.

Referring to FIG. 1, the semiconductor device of the present embodiment may include a first semiconductor structure 100 and a second semiconductor structure 200 that are stacked in a vertical direction. Here, the vertical direction may refer to a direction substantially perpendicular to a first surface (e.g., a top surface) 111 and a second surface (e.g., a bottom surface) 112 of a first semiconductor substrate 110 included in the first semiconductor structure 100, and/or a first surface (e.g., a top surface) 211 and a second surface (e.g., a bottom surface) 212 of a second semiconductor substrate 210 included in the second semiconductor structure 200. Compared to this, a horizontal direction may refer to a direction substantially parallel to the first surface 111 and the second surface 112 of the first semiconductor substrate 110, and/or the first surface 211 and the second surface 212 of the second semiconductor substrate 210. In addition, in the following description, positions in the vertical direction will be based on the cross-section of FIG. 1. For example, in FIG. 1, the second semiconductor structure 200 may be disposed over the first semiconductor structure 100. However, upper and lower positions are relative concepts, which may be reversed. If the upper and lower positions of the semiconductor device of FIG. 1 are reversed, the first semiconductor structure 100 would be disposed over the second semiconductor structure 200.

The first semiconductor structure 100 may include the first semiconductor substrate 110, a first wiring portion WP1 disposed over the first semiconductor substrate 110, and a first bonding pad 130 and a first insulating layer 132 disposed over the first wiring portion WP1. The first semiconductor substrate 110 may include a semiconductor material such as silicon or germanium, and may have the first surface 111, the second surface 112, and a side surface connecting the first surface 111 to the second surface 112. The first surface 111 may correspond to a front surface and/or an active surface on which the first wiring portion WP1 is disposed, and the second surface 112 may correspond to a rear surface positioned opposite to the front surface and/or an inactive surface.

The first wiring portion WP1 may be disposed over the first surface 111 of the first semiconductor substrate 110. The first wiring portion WP1 may include circuits and/or wiring structures variously implemented according to the function or type of the first semiconductor structure 100. For example, when the first semiconductor structure 100 is a memory chip including a volatile memory such as DRAM (Dynamic Random Access Memory) or SRAM (Static RAM), or a non-volatile memory such as NAND flash, RRAM (Resistive RAM), PRAM (Phase-change RAM), MRAM (Magneto-resistive RAM), FRAM (ferroelectric RAM), or the like, the first wiring portion WP1 may include a memory cell array including a plurality of memory cells. Alternatively, for example, when the first semiconductor structure 100 is a logic chip or controller including a peripheral circuit for driving a memory, the first wiring portion WP1 may include a peripheral circuit.

The first wiring portion WP1 may include a combination of one or more conductive layers CP1 and 120 as well as one or more interlayer insulating layers IL1 that are stacked in the vertical direction. In the present embodiment, five conductive layers CP1 and 120 and five interlayer insulating layers IL1 (in which the five conductive layers CP1 and 120 are buried) are shown, but the present disclosure is not limited thereto. The number of the conductive layers CP1 and 120 and the number of the interlayer insulating layers IL1 may be variously modified. In addition, the positions or shapes of the conductive layers CP1 and 120 are not limited to those illustrated, and the conductive layers CP1 and 120 may be arranged in various shapes, and each of the conductive layers CP1 and 120 may have various shapes such as a plate shape, a pillar shape, or the like, as needed. The conductive layers CP1 and 120 may include various conductive materials such as metal, metal nitride, or the like. The interlayer insulating layers IL1 may include various insulating materials such as silicon oxide, silicon nitride, or the like. The uppermost layer of the conductive layers CP1 and 120, that is in contact with the first bonding pad 130 to be described later, will be referred to as a first conductive layer 120 hereinafter. In the present embodiment, it is illustrated that two first conductive layers 120 are arranged spaced apart from each other in the horizontal direction, but the present disclosure is not limited thereto, and the number and arrangement of the first conductive layers 120 may be variously modified.

The first bonding pad 130 may be electrically connected to the first conductive layer 120 by contacting the top surface of the first conductive layer 120. Here, one first conductive layer 120 may overlap and contact a plurality of first bonding pads 130. The arrangement of the first conductive layer 120 and the plurality of first bonding pads 130 connected thereto in a plan view will be described later with reference to FIG. 2.

Meanwhile, in the present embodiment, the connection of the first bonding pad 130 to the first conductive layer 120 by directly contacting the first conductive layer 120 has been described, but the present disclosure is not limited thereto. Another conductive layer may be interposed between the first bonding pad 130 and the first conductive layer 120, and thus, the first bonding pad 130 and the first conductive layer 120 may be connected with each other through another conductive layer. Another conductive layer may have a pillar shape overlapping each of the plurality of first bonding pads 130 or a plate shape overlapping each of the first conductive layers 120. Even in this case, the plurality of first bonding pads 130 may overlap one first conductive layer 120 corresponding thereto.

The first bonding pad 130 may be for electrically connecting the first semiconductor structure 100 to the second semiconductor structure 200. The first bonding pad 130 may include various conductive materials, and may have a single-layer structure or a multi-layer structure. In particular, when the first bonding pad 130 is directly bonded to the second bonding pad 230 of the second semiconductor structure 200 to form a hybrid-bonding structure, the first bonding pad 130 may include a metal material that can be bonded to the second bonding pad 230 by mutual diffusion of metal through a high-temperature annealing process. For example, the first bonding pad 130 may include a metal such as copper (Cu), nickel (Ni), tin (Sn), gold (Au), or silver (Ag), a combination of these metals, or a compound of this metal.

The first insulating layer 132 may be formed to be filled between the first bonding pads 130 over the first wiring portion WP1. The first insulating layer 132 may include various insulating materials. In particular, when the first insulating layer 132 is directly bonded to the second insulating layer 232 of the second semiconductor structure 200 to form a hybrid-bonding structure, the first insulating layer 132 may include an insulating material that can be combined with the second insulating layer 232 through a covalent bond between insulating materials. For example, the first insulating layer 132 may include silicon oxide or silicon nitride.

The second semiconductor structure 200 may include the second semiconductor substrate 210, a second wiring portion WP2 disposed under the second semiconductor substrate 210, and the second bonding pad 230 and the second insulating layer 232 disposed under the second wiring portion WP2. This may be because the second semiconductor structure 200 is disposed over the first semiconductor structure 100 and bonded to the first semiconductor structure 100 in a state in which upper and lower portions of the second semiconductor structure 200 are reversed immediately after the second semiconductor structure 200 is fabricated. That is, during the fabricating process of the second semiconductor structure 200, similar to the first semiconductor structure 100, the second wiring portion WP2 may be formed over the second semiconductor substrate 210, and the second bonding pad 230 and the second insulating layer 232 may be formed over the second wiring portion WP2, in a state in which the first surface 211 of the second semiconductor substrate 210 faces upward and the second surface 212 of the second semiconductor substrate 210 faces downward.

The second semiconductor substrate 210 may include a semiconductor material such as silicon or germanium, and may have the first surface 211, the second surface 212, and a side surface connecting them to each other. The first surface 211 may correspond to a front surface and/or an active surface on which the second wiring portion WP2 is disposed, and the second surface 212 may correspond to a rear surface located opposite to the front surface and/or an inactive surface.

The second wiring portion WP2 may be disposed under the first surface 211 of the second semiconductor substrate 210. The second wiring portion WP2 may include circuits and/or wiring structures variously implemented according to the function or type of the second semiconductor structure 200. For example, when the second semiconductor structure 200 is a memory chip including a volatile memory or a non-volatile memory, the second wiring portion WP2 may include a memory cell array including a plurality of memory cells. Alternatively, for example, when the second semiconductor structure 200 is a logic chip or controller including a peripheral circuit for driving a memory, the second wiring portion WP2 may include a peripheral circuit. The second semiconductor structure 200 may have a type the same as the first semiconductor structure 100. For example, the first and second semiconductor structures 100 and 200 may include the same type of memory. Alternatively, the second semiconductor structure 200 may have a type different from the first semiconductor structure 100. For example, the first and second semiconductor structures 100 and 200 may include different types of memories, or one of the first and second semiconductor structures 100 and 200 may include a memory and the other of the first and second semiconductor structures 100 and 200 may include a peripheral circuit.

The second wiring portion WP2 may include a combination of one or more conductive layers CP2 and 220 and one or more interlayer insulating layers IL2 that are stacked in the vertical direction. In the present embodiment, five conductive layers CP2 and 220 and five interlayer insulating layers IL2 in which the five conductive layers CP2 and 220 are buried are shown, but the present disclosure is not limited thereto. The number of the conductive layers CP2 and 220 and the number of the interlayer insulating layers IL2 may be variously modified. In addition, the positions or shapes of the conductive layers CP2 and 220 are not limited to those illustrated, and the conductive layers CP2 and 220 may be arranged in various shapes, and each of the conductive layers CP2 and 220 may have various shapes such as a plate shape, a pillar shape, or the like, as needed. The conductive layers CP2 and 220 may include various conductive materials such as metal, metal nitride, or the like. The interlayer insulating layers IL2 may include various insulating materials such as silicon oxide, silicon nitride, or the like. The lowermost layer of the conductive layers CP2 and 220, that is in contact with the second bonding pad 230 to be described later, will be referred to as a second conductive layer 220 hereinafter. In the present embodiment, it is illustrated that two second conductive layers 220 are arranged spaced apart from each other in the horizontal direction, but the present disclosure is not limited thereto, and the number and arrangement of the second conductive layers 220 may be variously modified.

The second bonding pad 230 may be electrically connected to the second conductive layer 220 by contacting the second conductive layer 220 under the second conductive layer 220. Here, one second conductive layer 220 may overlap and contact a plurality of second bonding pads 230. The arrangement of the second conductive layer 220 and a plurality of second bonding pads 230 connected thereto in a plan view will be described later with reference to FIG. 2.

Meanwhile, in the present embodiment, the second bonding pad 230 directly contacts the second conductive layer 220 to be connected to the second conductive layer 220, but the present disclosure is not limited thereto. Another conductive layer may be interposed between the second bonding pad 230 and the second conductive layer 220, and thus, the second bonding pad 230 and the second conductive layer 220 may be connected with each other through another conductive layer. Another conductive layer may have a pillar shape overlapping each of the plurality of second bonding pads 230, or a plate shape overlapping each of the second conductive layers 220. Even in this case, the plurality of second bonding pads 230 may overlap one second conductive layer 220 corresponding thereto.

The second bonding pad 230 may be for electrically connecting the second semiconductor structure 200 to the first semiconductor structure 100. The second bonding pad 230 may include various conductive materials, and may have a single-layer structure or a multi-layer structure. In particular, when the second bonding pad 230 is directly bonded to the first bonding pad 130 of the first semiconductor structure 100 to form a hybrid-bonding structure, the second bonding pad 230 may include a metal material that can be bonded to the first bonding pad 130 by mutual diffusion of metal through a high-temperature annealing process. For example, the second bonding pad 230 may include a metal such as copper (Cu), nickel (Ni), tin (Sn), gold (Au), or silver (Ag), a combination of these metals, or a compound of this metal.

The second insulating layer 232 may be formed to be filled between the second bonding pads 230 under the second wiring portion WP2. The second insulating layer 232 may include various insulating materials. In particular, when the second insulating layer 232 is directly bonded to the first insulating layer 132 of the first semiconductor structure 100 to form a hybrid-bonding structure, the second insulating layer 232 may include an insulating material that can be combined with the first insulating layer 132 through a covalent bond between insulating materials. For example, the second insulating layer 232 may include silicon oxide or silicon nitride.

The first semiconductor structure 100 and the second semiconductor structure 200 may be bonded with each other in a state in which the first bonding pad 130 and the second bonding pad 230 face each other and the first insulating layer 132 and the second insulating layer 232 face each other, and accordingly, the semiconductor device of the present embodiment may be formed.

The second bonding pad 230 may be directly bonded to the first bonding pad 130, and the second insulating layer 232 may be directly bonded to the first insulating layer 132. This may be due to a method of performing a high-temperature annealing process in a state in which the first bonding pad 130 and the first insulating layer 132 are in contact with the second bonding pad 230 and the second insulating layer 232, respectively. During the high-temperature annealing, the first bonding pad 130 and the second bonding pad 230 may be combined with each other by mutual diffusion of metals, for example, copper, for forming the first bonding pad 130 and the second bonding pad 230. That is, the first bonding pad 130 and the second bonding pad 230 may form a metal-to-metal bond. In this process, the first insulating layer 132 and the second insulating layer 232 may be combined with each other by a covalent bond between insulating materials, for example, silicon oxide or silicon nitride, for forming the first insulating layer 132 and the second insulating layer 232. That is, the first insulating layer 132 and the second insulating layer 232 may form an insulator-to-insulator bond. Thus, hybrid-bonding between the first semiconductor structure 100 and the second semiconductor structure 200, that is, metal-to-metal bonding and insulator-to-insulator bonding may be achieved.

The plurality of first bonding pads 130 may be respectively bonded to the plurality of second bonding pads 230. That is, the first bonding pad 130 may be bonded to the second bonding pad 230 corresponding thereto. Here, the arrangement of the plurality of first bonding pads 130, the arrangement of the plurality of second bonding pads 230, and bonding between them will be described in detail with reference to FIG. 2.

Figure 2:
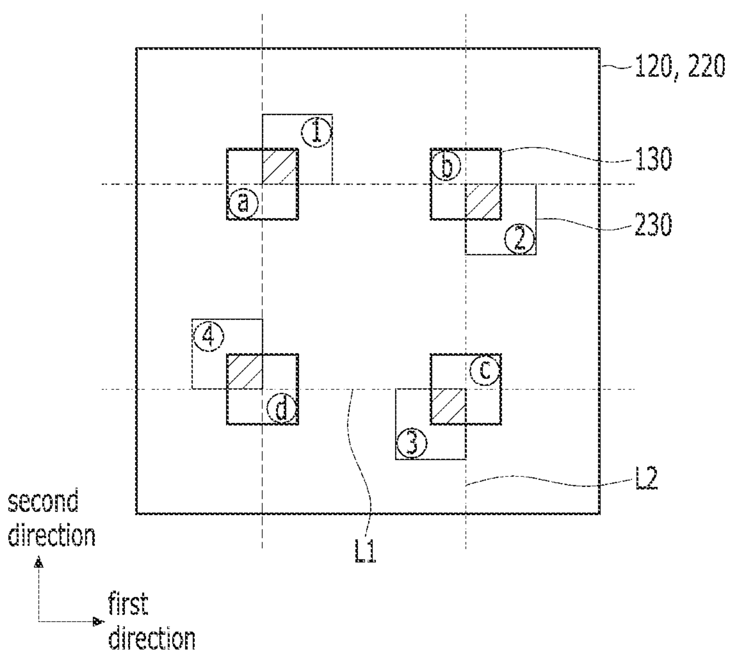
FIG. 2 is a plan view of a portion P1 of FIG. 1 viewed from above.

FIG. 2 is a plan view of a portion P1 of FIG. 1 viewed from above. FIG. 2 shows one first conductive layer 120 and a plurality of first bonding pads 130 connected thereto, and shows one second conductive layer 220 and a plurality of second bonding pads 230 connected thereto.

Referring to FIG. 2, the first conductive layer 120 may have a quadrangular shape having two sides parallel to a first direction and two sides parallel to a second direction intersecting the first direction in a plan view. The first direction and the second direction may be substantially perpendicular to each other. In addition, the first conductive layer 120 may have a square shape of which all four sides have substantially the same length in a plan view. However, the present disclosure is not limited thereto, and the first conductive layer 120 may have various shapes, such as a rectangular shape other than a square shape, a polygonal shape, a circular shape, an elliptical shape, or the like, in a plan view.

Four first bonding pads 130 may be connected to the first conductive layer 120, and may be arranged in a 2*2 shape along the first and second directions in a plan view. The four first bonding pads 130 may be referred to as a first bonding pad group. Although one first bonding pad group is illustrated in the present embodiment, the present disclosure is not limited thereto. The first conductive layer 120 may be connected to a plurality of first bonding pad groups. The plurality of first bonding pad groups may be arranged in a matrix form along the first and second directions in a plan view. In addition, in a plan view, each of the plurality of first bonding pads 130 may have a square shape. That is, each of the plurality of first bonding pads 130 may have two sides parallel to the first direction and two sides parallel to the second direction, and four sides may have substantially the same length. However, the present disclosure is not limited thereto, and each of the plurality of first bonding pads 130 may have various shapes, such as a rectangular shape other than a square shape, a polygonal shape, a circular shape, an elliptical shape, or the like, in a plan view.

The second conductive layer 220 may have a quadrangular shape having two sides parallel to the first direction and two sides parallel to the second direction intersecting the first direction in a plan view. In addition, the second conductive layer 20 may have a square shape of which all four sides have substantially the same length in a plan view. However, the present disclosure is not limited thereto, and the second conductive layer 220 may have various shapes, such as a rectangular shape other than a square shape, a polygonal shape, a circular shape, an elliptical shape, or the like, in a plan view. In the present embodiment, the second conductive layer 220 may have the same shape and size as the first conductive layer 120 in a plan view. However, the present disclosure is not limited thereto, and at least one of the shape and size of the second conductive layer 220 may be different from that of the first conductive layer 120.

Four second bonding pads 230 may be connected to the second conductive layer 220, and may be arranged in a 2*2 shape along the first and second directions in a plan view. The four second bonding pads 230 may be referred to as a second bonding pad group. In the present embodiment, only one second bonding pad group is illustrated, but the present disclosure is not limited thereto, and the second conductive layer 220 may be connected to a plurality of second bonding pad groups. The plurality of second bonding pad groups may be arranged in a matrix form along the first and second directions in a plan view. However, the number of second bonding pads 230 and the number of second bonding pad groups may be the same as the number of first bonding pads 130 and the number of first bonding pad groups, respectively. In addition, each of the plurality of second bonding pads 230 may have a square shape. That is, each of the plurality of second bonding pads 230 may have two sides parallel to the first direction and two sides parallel to the second direction in a plan view, and four sides have substantially the same length. However, the present disclosure is not limited thereto, and each of the plurality of second bonding pads 230 may have various shapes, such as a rectangular shape other than a square shape, a polygonal shape, a circular shape, an elliptical shape, or the like, in a plan view. In the present embodiment, the second bonding pad 230 may have the same shape and size as the first bonding pad 130. However, the present disclosure is not limited thereto, and at least one of the shape and size of the second bonding pad 230 may be different from that of the first bonding pad 130.

Here, FIG. 2 shows a case where the first conductive layer 120 and the first bonding pad group connected thereto are normally aligned with the second conductive layer 220 and the second bonding pad group connected thereto. Normal alignment may mean that misalignment does not occur.

When the first conductive layer 120 and the second conductive layer 220 are normally aligned, the center of the first conductive layer 120 and the center of the second conductive layer 220 may overlap each other. When the first conductive layer 120 and the second conductive layer 220 have the same shape and size, they may have sidewalls overlapping and aligned with each other. That is, in this figure, four sides of the first conductive layer 120 and four sides of the second conductive layer 220 may overlap each other.

On the other hand, when the first bonding pad group and the second bonding pad group are normally aligned, the centers of the first bonding pads 130 and the centers of the second bonding pads 230 corresponding thereto may not overlap each other, but may be shifted according to a certain rule. Accordingly, the first bonding pad 130 and the second bonding pad 230 corresponding thereto may be partially overlapped and bonded. As an example, this rule is described below. For reference, in the present embodiment, the first bonding pad 130 and the second bonding pad 230 may have the same size and the same square shape.

First, the four first bonding pads 130 may be arranged so that centers of two first bonding pads 130 arranged along the first direction are located on a virtual straight line (see dotted line L1) extending in the first direction, centers of two first bonding pads 130 arranged along the second direction are located on another virtual straight line (see dotted line L2) extending in the second direction. In other words, the four first bonding pads 130 may be arranged so that their centers respectively coincide with four intersections formed by two virtual straight lines L1 extending in parallel in the first direction and two virtual straight lines L2 extending in parallel in the second direction. The virtual straight line L1 in the first direction will be hereinafter referred to as a first straight line L1, and the virtual straight line L2 in the second direction will be hereinafter referred to as a second straight line L2. According to this arrangement, each of the four first bonding pads 130 may be equally divided into four regions by the first straight line L1 and the second straight line L2. Assuming that the first straight line L1 is the x-axis and the second straight line L2 is the y-axis, the four regions of each first bonding pad 130 may be referred to as a first quadrant, a second quadrant, a third quadrant, and a fourth quadrant, respectively. The first quadrant may be a region located at the upper side of the first straight line L1 and the right side of the second straight line L2. The second quadrant may be a region located at the lower side of the first straight line L1 and the right side of the second straight line L2. The third quadrant may be a region located at the lower side of the first straight line L1 and the left side of the second straight line L2. The fourth quadrant may be a region located at the upper side of the first straight line L1 and the left side of the second straight line L2. That is, the second quadrant, the third quadrant, and the fourth quadrant may be sequentially arranged in a clockwise direction from the first quadrant.

Next, the four second bonding pads 230 may be arranged along the first and second directions, and their centers may move (i.e., displace or dislocate) in directions from the centers of the four first bonding pads 130 toward different quadrants, respectively. By doing so, the four second bonding pads 230 may be arranged to overlap different quadrants of the four first bonding pads 130, respectively. For convenience of description, in a clockwise direction from the upper and left side in this plan view, the four first bonding pads 130 are marked as ⓐ, ⓑ, ⓒ, and ⓓ, respectively, and the four second bonding pads 230 corresponding to them are marked as ①, ②, ③, and ④, respectively.

As an example, the second bonding pad 230 corresponding to ① may overlap the first quadrant of the first bonding pad 130 corresponding to ⓐ, and may have a center overlapping a vertex where two sides of the first quadrant meet. Similarly, the second bonding pad 230 corresponding to ② may overlap the second quadrant of the first bonding pad 130 corresponding to ⓑ, and may have a center overlapping a vertex where two sides of the second quadrant meet. Similarly, the second bonding pad 230 corresponding to ③ may overlap the third quadrant of the first bonding pad 130 corresponding to ⓒ, and may have a center overlapping a vertex where two sides of the third quadrant meet. Similarly, the second bonding pad 230 corresponding to ④ may overlap the fourth quadrant of the first bonding pad 130 corresponding to ⓓ, and may have a center overlapping a vertex where two sides of the fourth quadrant meet.

In this case, a portion corresponding to ¼ of each first bonding pad 130 may overlap a portion corresponding to ¼ of each second bonding pad 230 corresponding thereto. When the area of each first bonding pad 130 is 1 and the area of each second bonding pad 230 corresponding thereto is 1, the overlapping area between each first bonding pad 130 and each second bonding pad 230 corresponding thereto may correspond to ¼. In this case, the overlapping area between the first bonding pad group and the second bonding pad group, that is, the total overlapping area between the four first bonding pads 130 and the four second bonding pads 230 may correspond to 4*¼, that is, 1.

According to the arrangement of the first bonding pads 130 and the second bonding pads 230 described above, even if misalignment occurs in the P1 portion of FIG. 1, the overlapping area between the first bonding pad group and the second bonding pad group may be kept substantially constant. An example having such a feature is shown in FIGS. 3A and 3B.

Figure 3A:
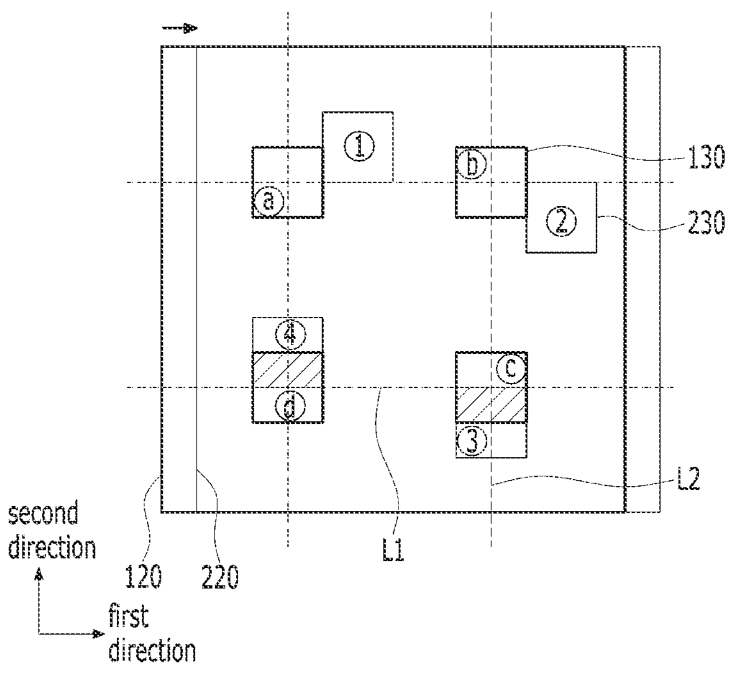
FIG. 3A is a plan view illustrating an example of a case in which misalignment occurs in the portion P1 of FIG. 1.
Figure 3B:
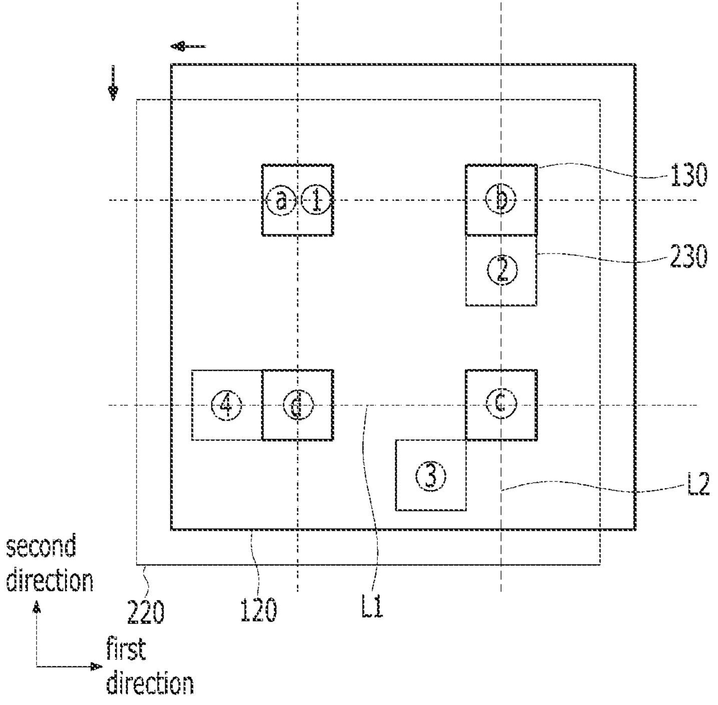
FIG. 3B is a plan view illustrating another example of a case in which misalignment occurs in the portion P1 of FIG. 1.

FIG. 3A is a plan view illustrating an example of a case in which misalignment occurs in the portion P1 of FIG. 1.

Referring to FIG. 3A, the second conductive layer 220 and the second bonding pad group connected thereto may be shifted to the right side by a predetermined degree as indicated by arrows, and thus, they may be misaligned to the first conductive layer 120 and the first bonding pad group.

Here, the predetermined degree may correspond to about half of the width of the second bonding pad 230 in the first direction. In this case, the first bonding pad 130 corresponding to ⓐ and the second bonding pad 230 corresponding to ① may not overlap each other, and the first bonding pad 130 corresponding to b and the second bonding pad 230 corresponding to ② may not overlap each other. On the other hand, the overlapping area between the first bonding pad 130 corresponding to ⓒ and the second bonding pad 230 corresponding to ③ may increase, and the overlapping area between the first bonding pad 130 corresponding to ⓐ and the second bonding pad 230 corresponding to ④ may increase. Since a portion corresponding to ½ of the first bonding pad 130 corresponding to ⓒ and a portion corresponding to ½ of the second bonding pad 230 corresponding to ③ overlap each other, the overlapping area between the first bonding pad 130 corresponding to ⓐ and the second bonding pad 230 corresponding to ③ may correspond to ½. Similarly, since a portion corresponding to ½ of the first bonding pad 130 corresponding to ⓐ and a portion corresponding to ½ of the second bonding pad 230 corresponding to ④ overlap each other, the overlapping area between the first bonding pad 130 corresponding to ⓐ and the second bonding pad 230 corresponding to ④ may correspond to ½. As a result, the overlapping area between the first bonding pad group and the second bonding pad group may correspond to 0+0+½+½, that is, ①. That is, the overlapping area between the first bonding pad group and the second bonding pad group may be substantially the same as that of FIG. 2.

FIG. 3B is a plan view illustrating another example of a case in which misalignment occurs in the portion P1 of FIG. 1.

Referring to FIG. 3B, the second conductive layer 220 and the second bonding pad group connected thereto may be shifted to the left and lower side by a predetermined degree as indicated by arrows, and thus, they may be misaligned to the first conductive layer 120 and the first bonding pad group connected thereto.

Here, the predetermined degree may correspond to about half of the width of the second bonding pad 230 in the first direction and about half of the width of the second bonding pad 230 in the second direction. In this case, the first bonding pad 130 corresponding to a and the second bonding pad 230 corresponding to ① may completely overlap each other. That is, the first bonding pad 130 corresponding to a and the second bonding pad 230 corresponding to ① may have four sidewalls aligned with each other, and the overlapping area between them may substantially correspond to ①. On the other hand, the first bonding pad 130 corresponding to b and the second bonding pad 230 corresponding to ② may not overlap each other, the first bonding pad 130 corresponding to ⓐ and the second bonding pad 230 corresponding to ③ may not overlap each other, and the first bonding pad 130 corresponding to ⓐ and the second bonding pad 230 corresponding to ④ may not overlap each other. As a result, the overlapping area between the first bonding pad group and the second bonding pad group may correspond to 1+0+0+0, that is, 1. That is, the overlapping area between the first bonding pad group and the second bonding pad group may be substantially the same as that of FIG. 2.

The constant overlapping area between the first bonding pad group and the second bonding pad group may mean that the contact area and contact resistance between them are constant. As a result, various characteristics such as speed and power of the semiconductor device may be stably maintained. If the first bonding pads 130 and the corresponding second bonding pads 230 have overlapping centers, the characteristics of the semiconductor device may not be stably secured because the overlapping area inevitably changes when misalignment occurs.

However, the overlapping area in FIGS. 3A and 3B may have a value of 1 as in FIG. 2 when the degree of misalignment in each of the first and second directions is less than half of the width of the second bonding pad 230. When the degree of misalignment is greater than half the width of the second bonding pad 230, the overlapping area may decrease. Nonetheless, the degree of reduction in the overlapping area may be small compared to the case where the first bonding pads 130 and the corresponding second bonding pads 230 have overlapping centers. Reducing the change in the overlap area may mean that the change in the contact area and contact resistance decreases, and accordingly, the change in the characteristics of the semiconductor device also decreases.

Meanwhile, in the above embodiment, the four second bonding pads 230 may sequentially overlap the first quadrant, the second quadrant, the third quadrant, and the fourth quadrant of the four first bonding pads 130, respectively, in a clockwise direction from the upper and left side. However, the present disclosure is not limited thereto, and as long as the quadrants of the four first bonding pads 130 respectively overlapping the four second bonding pads 230 are different from each other, the quadrants of the four first bonding pads 130 overlapping the four second bonding pads 230 may be modified in various ways.

In addition, in the above embodiment, the center of the second bonding pad 230 may be located at the vertex where the two sides of the quadrant of the first bonding pad 130 meet, and thus, the overlapping area between the first bonding pad 130 and the second bonding pad 230 may correspond to ¼ of the area of each first bonding pad 130 and/or the area of each second bonding pad 230 corresponding thereto. However, the present disclosure is not limited thereto, and the center of the second bonding pad 230 may be located outside or within the quadrant. In this case, the overlapping area between the first bonding pad 130 and the second bonding pad 230 may have a value other than ¼. An embodiment having such a feature will be described with reference to FIG. 4 below.

Also, in the above embodiment, the first and second bonding pads 130 and 230 may have the same size. However, in another embodiment, the first and second bonding pads 130 and 230 may have different sizes. An embodiment having such a feature will be described with reference to FIG. 5 below.

Also, in the above embodiment, the first and second bonding pads 130 and 230 may have the same shape. However, in another embodiment, the first and second bonding pads 130 and 230 may have different shapes. An embodiment having such a feature will be described with reference to FIG. 6 below.

Figure 4:
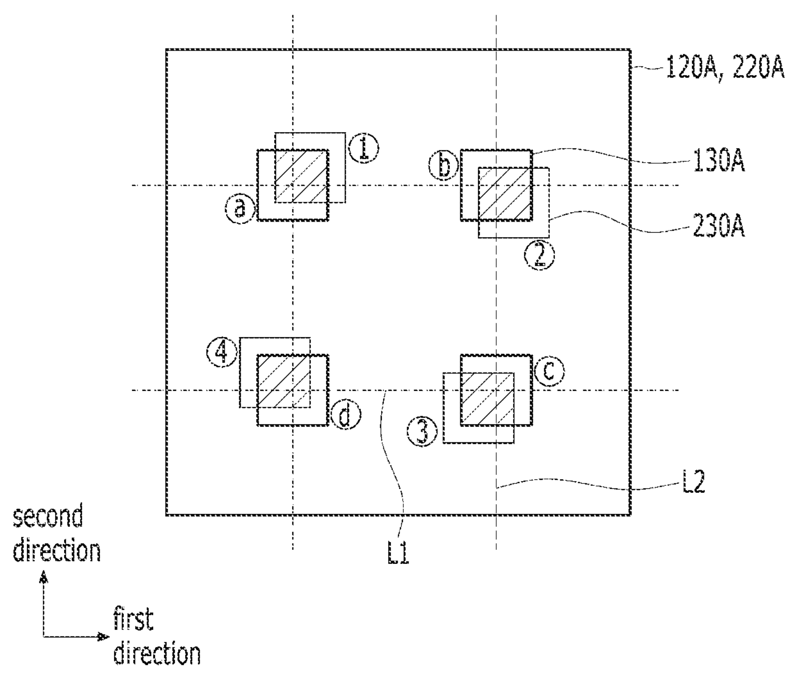
FIG. 4 is a plan view illustrating an arrangement of a conductive layer and bonding pads according to another embodiment of the present disclosure.

FIG. 4 is a plan view illustrating an arrangement of a conductive layer and bonding pads according to another embodiment of the present disclosure. Similar to FIG. 2, a case where the bonding pads are normally aligned, that is, a case where the centers of the conductive layers overlap each other is shown. Differences from the above-described embodiment of FIG. 2 will be mainly described.

Referring to FIG. 4, four first bonding pads 130A connected to a first conductive layer 120A may be arranged so that the centers of the four first bonding pads 130A coincide with four intersections formed by two first straight lines L1 in the first direction and two second straight lines L2 in the second direction.

Four second bonding pads 230A connected to a second conductive layer 220A may be arranged along the first direction and the second direction, and their centers may move in directions from the centers of the four first bonding pads 130A toward different quadrants, respectively. By doing so, the four second bonding pads 230A may be arranged to overlap different quadrants of the four first bonding pads 130A, respectively. Here, the center of each second bonding pad 230A may be located within the quadrant.

As an example, the second bonding pad 230A corresponding to ① may overlap the first quadrant of the first bonding pad 130A corresponding to ⓐ, and may have a center located within the first quadrant. In this case, the second bonding pad 230A corresponding to ① may overlap a whole of the first quadrant of the first bonding pad 130A corresponding to ⓐ and also overlap portions of the second to fourth quadrants adjacent to the first quadrant. Similarly, the second bonding pad 230A corresponding to ② may overlap the second quadrant of the first bonding pad 130A corresponding to ⓑ, and may have a center located within the second quadrant. In this case, the second bonding pad 230A corresponding to ② may overlap a whole of the second quadrant of the first bonding pad 130A corresponding to ⓑ and also overlapping portions of the first, third, and fourth quadrants adjacent to the second quadrant. Similarly, the second bonding pad 230A corresponding to ③ may overlap the third quadrant of the first bonding pad 130A corresponding to ⓒ, and may have a center located within the third quadrant. In this case, the second bonding pad 230A corresponding to ③ may overlap a whole of the third quadrant of the first bonding pad 130A corresponding to ⓒ and also overlap portions of the first, second, and fourth quadrants adjacent to the third quadrant. Similarly, the second bonding pad 230A corresponding to ④ may overlap the fourth quadrant of the first bonding pad 130A corresponding to ⓓ, and may have a center located within the fourth quadrant. In this case, the second bonding pad 230A corresponding to ④ may overlap a whole of the fourth quadrant of the first bonding pad 130A corresponding to ⓓ and also overlap portions of the first to third quadrants adjacent to fourth quadrant.

In this case, a portion corresponding to 1/n of each first bonding pad 130A may overlap a portion corresponding to 1/n of each second bonding pads 230A corresponding thereto. Here, n may have a value less than 4. When the area of each first bonding pad 130A is 1 and the area of each second bonding pad 230A corresponding thereto is 1, the overlapping area between each first bonding pad 130A and each second bonding pad 230A corresponding thereto may correspond to 1/n. That is, the overlapping area between each first bonding pad 130A and each second bonding pad 230A corresponding thereto may be increased compared to the above-described embodiment of FIG. 2. In this case, the overlapping area of the first bonding pad group, that is, the four first bonding pads 130A and the second bonding pad group, that is, the four second bonding pads 230A may correspond to 4*1/n.

According to the arrangement of the first bonding pads 130A and the second bonding pads 230A described above, even if misalignment occurs between the first bonding pad group and the second bonding pad group, the overlapping area between them may be limited to a predetermined degree, or the change in overlapping area may decrease.

Meanwhile, in FIG. 4, the case where the center of the second bonding pad 230A is located within the quadrant of the first bonding pad 130A has been described. However, in another embodiments, the center of the second bonding pad 230A may be located outside the quadrant of the first bonding pad 130A. In this case, the overlapping area between the second bonding pad 230A and the first bonding pad 130A may be reduced compared to the embodiment of FIG. 2. That is, the second bonding pad 230A may overlap a portion of the quadrant of the first bonding pad 130A, and n described above may have a value greater than 4. Except for this point, there is no substantial difference from that described in FIG. 4.

Figure 5:
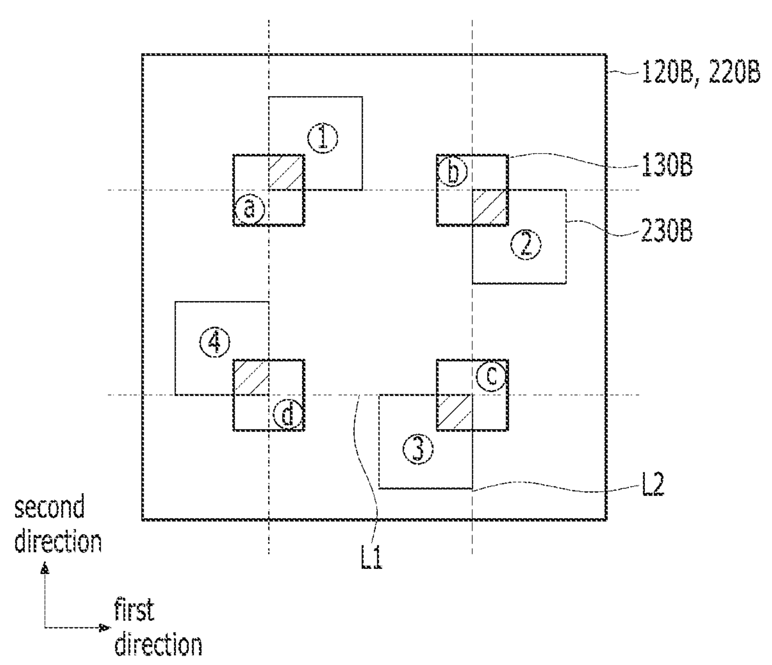
FIG. 5 is a plan view illustrating an arrangement of a conductive layer and bonding pads according to still another embodiment of the present disclosure.

FIG. 5 is a plan view illustrating an arrangement of a conductive layer and bonding pads according to another embodiment of the present disclosure. Similar to FIG. 2, a case where the bonding pads are normally aligned, that is, a case where the centers of the conductive layers overlap is shown. Differences from the above-described embodiment of FIG. 2 will be mainly described.

Referring to FIG. 5, four first bonding pads 130B connected to a first conductive layer 120B may be arranged so that the centers of the four first bonding pads 130B coincide with four intersections formed by two first straight lines L1 in the first direction and two second straight lines L2 in the second direction.

Four second bonding pads 230B connected to a second conductive layer 220B may be arranged along the first and second directions, and their centers may move in directions from the centers of the four first bonding pads 130B toward different quadrants, respectively. By doing so, the four second bonding pads 230B may be arranged to overlap different quadrants of the four first bonding pads 130B, respectively. Here, the second bonding pad 230B may have a larger planar area than the first bonding pad 130B.

As an example, the second bonding pad 230B corresponding to ① may overlap the first quadrant of the first bonding pad 130B corresponding to ⓐ, and may have a larger size than the first bonding pad 130B so as to have a center located outside the first quadrant. Similarly, the second bonding pad 230B corresponding to ② may overlap the second quadrant of the first bonding pad 130B corresponding to ⓑ, and may have a larger size than the first bonding pad 130B so as to have a center located outside the second quadrant. Similarly, the second bonding pad 230B corresponding to ③ may overlap the third quadrant of the first bonding pad 130B corresponding to ⓒ, and may have a larger size than the first bonding pad 130B so as to have a center located outside the third quadrant. Similarly, the second bonding pad 230B corresponding to ④ may overlap the fourth quadrant of the first bonding pad 130B corresponding to ⓓ, and may have a larger size than the first bonding pad 130B so as to have a center located outside the fourth quadrant.

In this case, a portion corresponding to ¼ of each first bonding pad 130B may overlap a portion corresponding to 1/n of each second bonding pads 230B corresponding thereto. Here, n may have a value greater than 4. When the area of each first bonding pad 130B is 1, the area of each second bonding pad 230B corresponding thereto may be greater than 1, and the overlapping area between each first bonding pad 130B and each second bonding pad 230B corresponding thereto may correspond to ¼. In this case, the overlapping area of the first bonding pad group, that is, the four first bonding pads 130B and the second bonding pad group, that is, the four second bonding pads 230B may correspond to 4*¼, that is, 1.

According to the arrangement of the first bonding pads 130B and the second bonding pads 230B described above, even if misalignment occurs between the first bonding pad group and the second bonding pad group, the overlapping area between them may be limited to a predetermined degree, or the change in overlapping area may decrease.

Figure 6:
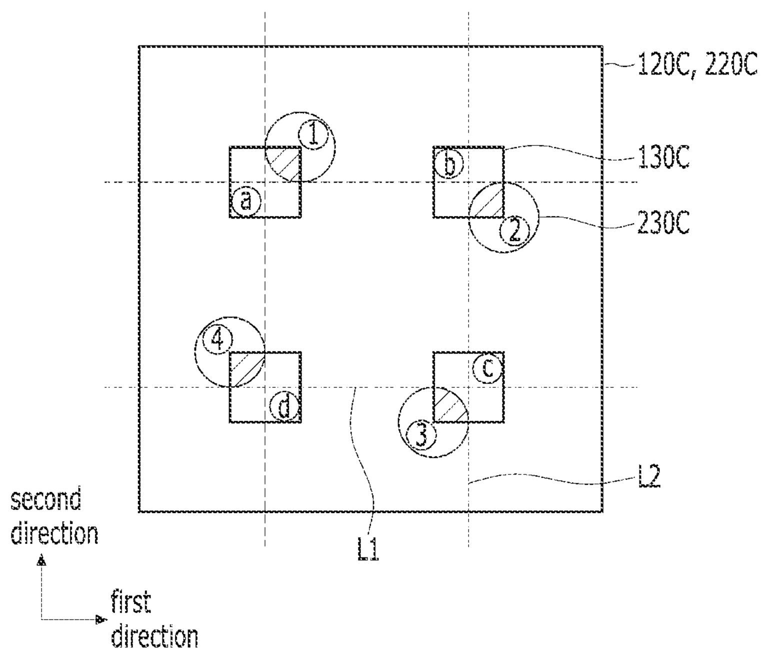
FIG. 6 is a plan view illustrating an arrangement of a conductive layer and bonding pads according to yet another embodiment of the present disclosure.

FIG. 6 is a plan view illustrating an arrangement of a conductive layer and bonding pads according to another embodiment of the present disclosure. Similar to FIG. 2, a case where the bonding pads are normally aligned, that is, a case where the centers of the conductive layers overlap is shown. Differences from the above-described embodiment of FIG. 2 will be mainly described.

Referring to FIG. 6, four first bonding pads 130C connected to a first conductive layer 120C may be arranged so that the centers of the four first bonding pads 130C coincide with four intersections formed by two first straight lines L1 in the first direction and two second straight lines L2 in the second direction.

Four second bonding pads 230C connected to a second conductive layer 220C may be arranged along the first and second directions, and their centers may move in directions from the centers of the four first bonding pads 130C toward different quadrants, respectively. By doing so, the four second bonding pads 230C may be arranged to overlap different quadrants of the four first bonding pads 130C, respectively. Here, the second bonding pad 230C may have a circular shape, unlike the first bonding pad 130C having a square shape.

As an example, the second bonding pad 230C corresponding to ① may overlap the first quadrant of the first bonding pad 130C corresponding to ⓐ, and may have a center overlapping a vertex where two sides of the first quadrant meet. Similarly, the second bonding pad 230C corresponding to ② may overlap the second quadrant of the first bonding pad 130C corresponding to ⓑ, and may have a center overlapping the vertex where two sides of the second quadrant meet. Similarly, the second bonding pad 230C corresponding to ③ may overlap the third quadrant of the first bonding pad 130C corresponding to C, and may have a center overlapping a vertex where two sides of the third quadrant meet. Similarly, the second bonding pad 230C corresponding to ④ may overlap the fourth quadrant of the first bonding pad 130C corresponding to ⓐ, and may have a center overlapping a vertex where two sides of the fourth quadrant meet.

In this case, a portion corresponding to 1/n of each first bonding pad 130C may overlap a portion corresponding to ¼ of each second bonding pads 230C corresponding thereto. Here, n may have a value greater than 4. When the area of each second bonding pad 230C is 1, the area of each first bonding pad 130C corresponding thereto may be greater than 1, and the overlapping area between each first bonding pad 130C and each second bonding pad 230C corresponding thereto may correspond to ¼. In this case, the overlapping area of the first bonding pad group, that is, the four first bonding pads 130C and the second bonding pad group, that is, the four second bonding pads 230C, may correspond to 4*¼, that is, 1.

According to the arrangement of the first bonding pads 130C and the second bonding pads 230C described above, even if misalignment occurs between the first bonding pad group and the second bonding pad group, the overlapping area between them may be limited to a predetermined degree, or the change in overlapping area may decrease.

According to the above embodiments of the present disclosure, it is possible to provide a semiconductor device capable of preventing or reducing a change in contact resistance between bonding pads even when misalignment occurs between the bonding pads of two semiconductor structures.

Although various embodiments have been described for illustrative purposes, it will be apparent to those skilled in the art that various changes and modifications may be made without departing from the spirit and scope of the present teachings as defined in the following claims.

What is claimed is:

1. A semiconductor device comprising:

a first semiconductor structure including a first conductive layer and four first bonding pads connected to the first conductive layer; and a second semiconductor structure including a second conductive layer and four second bonding pads connected to the second conductive layer, wherein the four first bonding pads are configured to be disposed to have respective centers each overlapping four intersections that are formed by two virtual first straight lines extending in parallel in a first direction and two virtual second straight lines extending in parallel in a second direction intersecting the first direction, where each of the four first bonding pads has a first quadrant, a second quadrant, a third quadrant, and a fourth quadrant divided by a corresponding one of the two virtual first straight lines and a corresponding one of the two virtual second straight lines, and wherein, when the first semiconductor structure and the second semiconductor structure are normally aligned, the four second bonding pads are configured to be disposed to have respective centers that are displaced in directions from the respective centers of the four first bonding pads toward different quadrants so that a first one of the four second bonding pads overlaps at least a portion of the first quadrant of a first one of the four first bonding pads corresponding thereto, a second one of the four second bonding pads overlaps at least a portion of the second quadrant of a second one of the four first bonding pads corresponding thereto, a third one of the four second bonding pads overlaps at least a portion of the third quadrant of a third one of the four first bonding pads corresponding thereto, and a fourth one of the four second bonding pads overlaps at least a portion of the fourth quadrant of a fourth one of the four first bonding pads corresponding thereto.

2. The semiconductor device according to claim 1, wherein overlapping areas between the four first bonding pads and the four second bonding pads are same as each other.

3. The semiconductor device according to claim 1, wherein the four first bonding pads and the four second bonding pads are configured to form a metal-to-metal bond.

4. The semiconductor device according to claim 3, wherein:

the first semiconductor structure further includes a first insulating layer filled between the four first bonding pads, the second semiconductor structure further includes a second insulating layer filled between the four second bonding pads, and the first insulating layer and the second insulating layer are configured to form an insulator-to-insulator bond.

5. The semiconductor device according to claim 1, wherein each of the four first bonding pads and each of the four second bonding pads are configured to have same area and shape in a plan view.

6. The semiconductor device according to claim 5, wherein an area of each first bonding pad overlapping a corresponding second bonding pad is configured to be substantially same as an area of the second bonding pad overlapping the first bonding pad.

7. The semiconductor device according to claim 5, wherein the four first bonding pads and the four second bonding pads are configured to have a square shape in a plan view, wherein an area of each first bonding pad overlapping a corresponding second bonding pad correspond to ¼ of an area of each first bonding pad or each second bonding pad.

8. The semiconductor device according to claim 1, wherein the four first bonding pads and the four second bonding pads are configured to have different areas in a plan view.

9. The semiconductor device according to claim 8, wherein an area of the first bonding pad overlapping the second bonding pad and an area of the second bonding pad overlapping the first bonding pad are configured to be different from each other.

10. The semiconductor device according to claim 1, wherein the first bonding pad and the second bonding pad are configured to have different shapes in a plan view.

11. The semiconductor device according to claim 10, wherein an area of the first bonding pad overlapping the second bonding pad and an area of the second bonding pad overlapping the first bonding pad are configured to be different from each other.

12. The semiconductor device according to claim 1, wherein, when the first semiconductor structure and the second semiconductor structure are misaligned, a total overlapping area between the four first bonding pads and the four second bonding pads is maintained.

13. The semiconductor device according to claim 1, wherein the first semiconductor structure further includes one or more first conductive layers, and the four first bonding pads are configured to be connected to each of the one or more first conductive layers.

14. The semiconductor device according to claim 1, wherein, when the four first bonding pads form a bonding pad group, the first conductive layer is configured to be connected to one or more bonding pad groups.

15. The semiconductor device according to claim 1, wherein the first semiconductor structure and the second semiconductor structure include same type of memory.

16. The semiconductor device according to claim 1, wherein the first semiconductor structure and the second semiconductor structure include different types of memory.

17. The semiconductor device according to claim 1, wherein one of the first semiconductor structure and the second semiconductor structure includes a memory and the other of the first semiconductor structure and the second semiconductor structure includes a peripheral circuit for driving the memory.

18. The semiconductor device according to claim 1, when the first semiconductor structure and the second semiconductor structure are normally aligned, a center of the first conductive layer and a center of the second conductive layer overlap with each other.

19. The semiconductor device according to claim 12, when the first semiconductor structure and the second semiconductor structure are misaligned, one of the centers of the first conductive layer and the second conductive layer displaces within a predetermined limit from the other of the centers of the first conductive layer and the second conductive layer.

20. The semiconductor device according to claim 1, wherein when the first semiconductor structure and the second semiconductor structure are normally aligned, respective vertices of the four second bonding pads contact the respective centers of the four first bonding pads.

* * * * *